INVENTORS:
MARTIN MÜLLER
ANTON LAUER
BY
Michael S. Striker
Atty

SECTION A-A

SECTION B-B

INVENTORS.
MARTIN MÜLLER
ANTON LAUER
BY
Michael S. Striker
Atty

United States Patent Office

3,076,156

Patented Jan. 29, 1963

3,076,156

HIGH FREQUENCY COUPLING ARRANGEMENTS FOR TRAVELING WAVE TUBES

Martin Müller and Anton Lauer, Ulm (Danube), Germany, assignors to Telefunken Gesellschaft fuer drahtlose Telegraphie G.m.b.H., Hannover, Germany Filed Mar. 12, 1953, Ser. No. 341,962
7 Claims. (Cl. 333—31)

The present invention relates to high frequency coupling arrangements which may be used with travelling wave tubes.

One of the basic difficulties when coupling an input or output line to a travelling wave tube in order to excite a helix, or whatever other delay structure might be provided, is to match the characteristic impedance of the input or output transmission line to the input impedance of the delay structure used in a travelling wave tube. As is well known in the art when this impedance match is obtained a minimum reflection of input signal will result, thereby resulting in a high transmission ratio of the signal fed via the input transmission line circuit to the delay line structure in the travelling wave tube.

Various arrangements have been employed in the prior art in order to couple two transmission lines and to simultaneously obtain the necessary impedance match referred to above. One of the most familiar schemes employed involves an arrangement wherein it is necessary to change the diameter and the pitch of the helix as it is brought toward the input line in order to couple the helix to such line and simultaneously to obtain the satisfactory impedance match between the helix and the input transmission line. This requires an empirical approach which involves trial and error before a satisfactory impedance match will be obtained.

It is therefore an object of the present invention to provide a simple coupling arrangement for coupling a high frequency input or output line to a high frequency delay line located in a traveling wave tube.

It is a further object to provide a broad band coupling arrangement which may be used with travelling wave tube input and output circuits.

It is yet another object of this invention to provide a coupling arrangement for travelling wave tubes which is simple to construct.

Still another object of this invention is to provide a coupling arrangement for travelling wave tubes having high transmission ratios.

An additional object of the present invention is to provide a coupling arrangement which will permit the construction of a rugged travelling wave tube.

In addition to the above objects it is yet another object to provide a coupling arrangement which will permit the use of a metallic vacuum envelope or a glass envelope.

With the above objects in view the present invention mainly consists of a high frequency coupling arrangement for use with a travelling wave tube, or the like, comprising of a vacuum-tight envelope, a pair of transmission lines the first of which is located outside of the envelope and the second of which is located inside of the envelope and forms an extension of the first transmission line, the pair of transmission lines propagating the same oscillatory mode, a uniform helix located in the envelope and having one end coupled to the second transmission line, and matching means forming part of one of the pair of transmission lines for matching the impedance of the helix line to the first transmission line.

The novel features which are considered as characteristic for the invention are set forth in particular in the appended claims. The invention itself, however, both as to its construction and its method of operation, together with additional objects and advantages thereof, will be best understood from the following description of specific embodiments when read in connection with the accompanying drawings, in which:

FIG. 1 is a simple sectional illustration of one form of the coupling arrangement in accordance with the invention;

FIG. 1*a* is a modification of the sectional illustration of FIG. 1;

Figure 4:
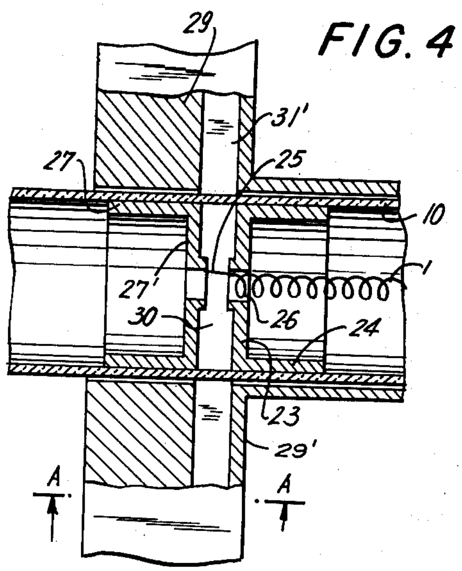
FIG. 4 shows another modification of the arrangement shown in FIGS. 1 to 4, the input transmission line being a ridged wave guide.
Figure 4A:
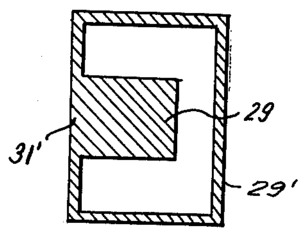
Figure 5:
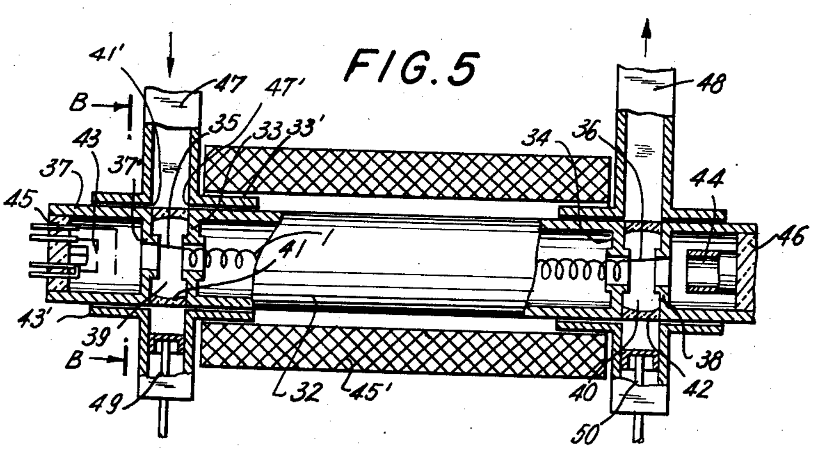
Figure 5A:
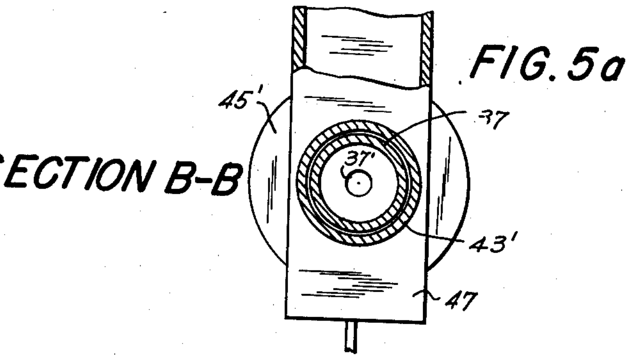
Figure 6:
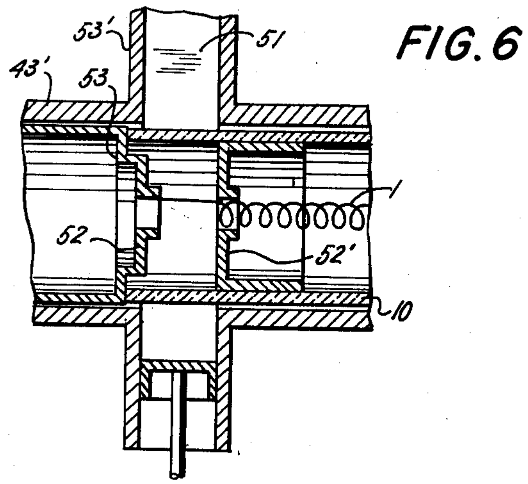
Figure 7:
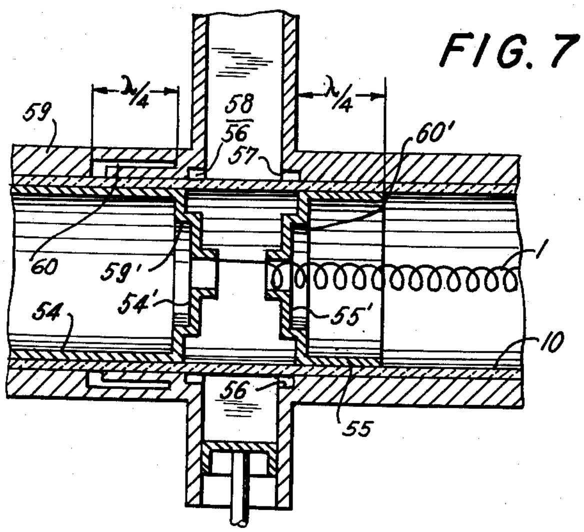

FIG. 4*a* is a section taken at A—A of FIG. 4 in the direction of the arrows;

FIG. 5 illustrates a travelling wave tube in which the coupling arrangement, according to the present invention, is used at the input and output lines;

FIG. 5*a* is a plan view of a section taken at line B—B of FIG. 5 in the direction of the arrows;

FIG. 6 illustrates yet another modification in accordance with the invention; and FIG. 7 shows a further embodiment of the present invention.

Figure 1:
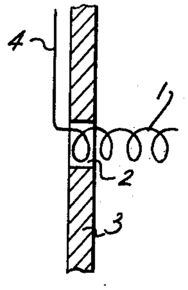

Referring now to the drawings, FIG. 1 illustrates the simplest coupling arrangement which may be used in accordance with the present invention. The last winding of the delay line, or helix, 1 is arranged in the central aperture 2 of the disc plate 3. A wire 4 extending from the last winding of the uniform helix is arranged parallel and spaced from the disc plate 3 which is preferably made of metal. The wall of the central aperture is arranged as close as possible to the helix 1 without touching the same. An electron stream (not shown) is adapted to flow in the direction of the axis of the helix 1 through the aperture 2 in disc plate 3.

The metallic disc 3 forms one of the conductors of a two-wire line, the wire 4 extending from the last winding of the helix 1 forming the second conductor of the two-wire line. The input impedance of this two-wire line depends upon the spacing between the metallic disc 3 and the wire 4 extending from the helix 1, and by the diameter of such wire. As a result, it is possible to design the thus formed two-wire line to have a definite input impedance so that when such line is connected to an input transmission line a good impedance match between such input transmission line and the helix 1 may be obtained.

Figure 1A:
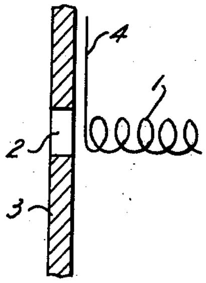

FIG. 1*a* is a modification of FIG. 1 and illustrates an arrangement wherein the helix is arranged outside and in front of said aperture 2 formed in the disc plate 3. The wire 4 extending from the last winding of the helix 1 is arranged alongside the disc plate 3 so as once again to form a two-wire transmission line. As in the case of the arrangement shown in FIG. 1, the input impedance of this two-wire line is determined solely by the geometry of the arrangement, namely, the spacing between the two conductors and the diameter of the wire 4.

Figure 2:
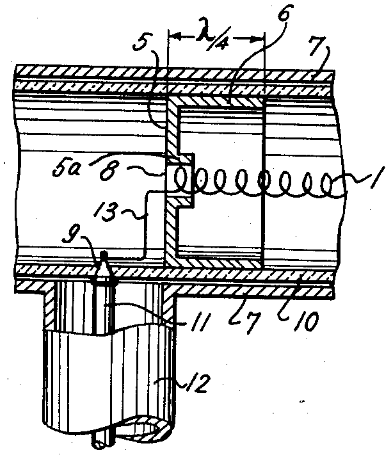
FIG. 2 illustrates a coupling arrangement partly in section that may be used when the input transmission line is a coaxial line.

FIG. 2 shows in greater detail the coupling arrangement illustrated in FIG. 1, wherein a coaxial line having an inner conductor 11 and an outer conductor 12 serve as the input transmission line. The end winding of the helix 1 is arranged in a hollow metal tube 5*a* joined to the apertured metal disc 5. As in FIGS. 1 and 1*a*, a wire 13 extending from the end winding of the helix 1 is arranged alongside the apertured metal disc 5 and spaced therefrom. The wire extension 13 is connected to the center conductor 11, which center conductor feeds through the glass envelope 10, so as to have a portion thereof located within the evacuated portion of the travelling wave tube. A glass envelope 10 serves as the vacuum envelope. A hollow cylindrical metalic tube 7 encloses the elongated glass envelope 10 and serves as a protective body therefor. In order to obtain an effective short circuit between the outer conductor 12 of the input coaxial line and the apertured metal disc 5, a hollow cylindrical coupling member 6 is provided which is joined at the rim of the apertured metal disc 5, the length of the cylindrical metal member 6 being one quarter of a wave length, or odd quarter wave length multiples thereof. The electron stream (not shown) is adapted to pass through the aperture of metal disc 5, and through the helix 1. The coupling arrangement illustrated in FIG. 2 may not only be used at the input end of the travelling wave tube, but may also be employed at the output end of the travelling wave tube. A mechanical strain is avoided by means of the mushroom-shaped feed-through 9 provided in the glass vessel 10. This feed-through arrangement also makes it possible to easily connect an input coaxial line to the travelling wave tube.

Figure 3:
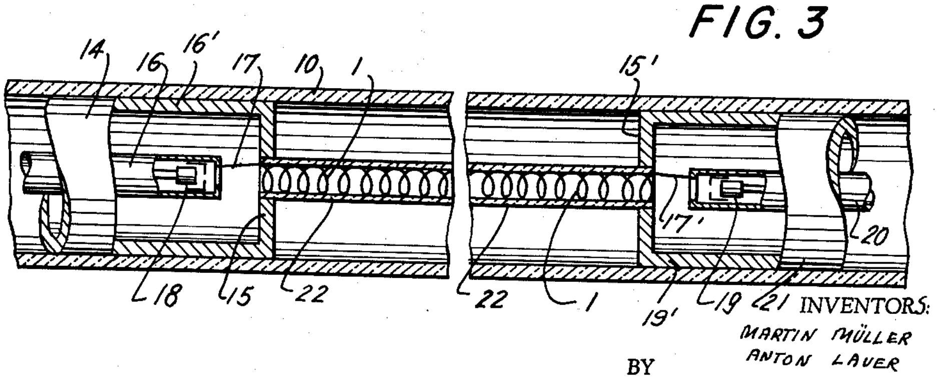
FIG. 3 is a modification of the arrangement shown in FIG. 2.

FIG. 3 illustrates in greater detail a coupling arrangement for coupling both an input and an output coaxial line to a travelling wave tube. The coaxial line 14 consisting of the inner conductor 16 and the outer conductor 16', represents the input transmission line. The coaxial line 21, consisting of the inner conductor 20 and the outer conductor 19', represents the output transmission line. As is clearly shown each of these input and output transmission lines, respectively, is coupled to the helix 1. A pair of apertured metal discs 15 and 15' serve to short circuit the outer conductors 16' and 19', respectively. The inner conductors 16 and 20 of coaxial lines 14 and 21, respectively, are spaced from the short circuiting metal discs 15 and 15'. The helix 1 has an end turn located in the apertures of the metal discs 15 and 15', respectively, the radial distance of the metal discs from the helix, as well as the length of the helix section surrounded by the apertured metal discs 15, 15' being proportional to the magnitude of the pitch of the helix. The wires 17 and 17' extending from the end turn of the helix are connected to the inner conductors 16 and 20, respectively. Within the inner conductor 16 there is provided an electron gun 18 for emitting electrons which pass through the apertured metal disc 15, through the helix 1 without being intercepted by the same, through the apertured metal disc 15' and are finally collected by the collector electrode 19. A glass tube 22 encloses the helix 1 insuring a vacuum-tight enclosure and simultaneously serves to support the same. It is possible to eliminate the glass envelope 10 between the metal disc portions 15 and 15', by connecting the glass tube 22 about the inner conductors 16 and 20 of coaxial lines 14 and 21, respectively, in a vacuum-tight manner. The input and output coaxial coupling lines may be brought out of the vacuum enclosing glass vessel 10 by means of circular discs or cylindrically formed feed-throughs. As in the case of FIGS. 1, 1*a* and 2, the input impedance of the coupling structure depends upon the geometry of the arrangement. In particular, the matching characteristics are determined by the diameter of apertures in discs 15, 15', the diameter of the wires 17 and 17', and the distance between the center conductors 16 and 20 from the short circuiting metal discs 15 and 15', respectively.

In FIG. 4 there is illustrated a sectional view of a coupling arrangement wherein an input hollow ridged wave guide transmission line is coupled to a delay line or uniform helix 1 which is located in a travelling wave tube. In this particular arrangement two apertured metal discs 27' and 23 are provided which discs, for example, may be similar to the heretofore described arrangements, however not necessarily so. The apertured metal discs 27' and 23 illustrated in FIG. 4 are similar, however, to the metal disc illustrated in the coupling arrangement of FIG. 2. The helix 1, at an end turn thereof 26, is located in the apertured metal disc 23, spaced therefrom, the radial distance of the metal discs from the helix 1 as well as the length of the helix section surrounded by the apertured disc 23 being proportional to the magnitude of the pitch of the helix. The wire 25 extending from the last turn 26 of the helix 1, is connected to the metal disc 27' in such manner as not to interfere with the electron flow (not shown) passing through the apertures formed in the metal discs 27' and 23, respectively. The extended helix wire 25 is projected from the end turn 26 of the helix 1 in approximately a rectilinear fashion so that it is substantially perpendicular to the respective metal discs 27', 23. Each of the metal discs 27', 23 is provided with a hollow cylindrical metal tube joined at the rims thereof. Each of the hollow cylindrical metal tubes 27, 24 joined at the rims of the apertured metal discs extend in opposite directions away from each other. The cylindrical metal tubes 27, 24 each have a length equal to a quarter wave length, or multiples of odd quarter wave lengths.

The elongated tubular ridged wave guide 31', is formed with a pair of aligned openings, similar to the arrangement shown in FIG. 5 and FIG. 5*a*. The wave guide 47 illustrated in FIG. 5*a* is arranged in similar manner to the ridged wave guide 29', shown in FIG. 4, except for the fact that the wave guide 47 does not have the ridged formation 29 shown in FIG. 4*a*. A vacuum-tight envelope 10 extends through the aligned opening in the opposite wall portions of the ridged wave guide section insuring a vacuum-tight enclosure for the travelling wave tube (not shown in detail). As in the case of FIG. 2, the cylindrical metallic hollow tubes 24, 27 have a length which is equal to a quarter of a wave length or odd multiples thereof, the design wave length being the wave length of the frequency of the band of frequencies to be coupled to the helix arranged in a travelling wave tube. The cylindrical hollow tubes serve to effectively create a low impedance connection between the ridged wave guide input line and the apertured metallic discs 27', 23, so that in effect the metallic discs form a continuation of the input transmission line. To insure an input impedance in the transmission line formed by the two metal discs which is equal to the input impedance of the ridged wave guide line, the two metal discs are spaced so that they are in substantial alignment with the top surface of the ridge portion 29, and the wave guide wall 29' facing the top surface of the ridge portion 29, respectively. A tuning plunger similar to that shown in FIG. 5, but having a different cross-section to conform to the cross-section of the ridged wave guide transmission line, is used to match the impedance of the input ridged wave guide transmisison line to the input of the helix 1. FIG. 4*a* is a section taken across line A—A of FIG. 4 and serves to more clearly show the ridged portion 29 in the hollow wave guide 31'.

FIG. 5 illustrates in greater deail a coupling arrangement already partially explained with reference to FIG. 4. FIG. 5 serves to show an input and output coupling arrangement in accordance with the present invention, in conjunction with a travelling wave tube shown in full detail.

An elongated tubular wave guide 47 is shown which may be designed to propagate the dominant $TE_{1,0}$ mode. The elongated tubular wave guide 47 is formed with a pair of aligned openings 41', 47' in the broad wall thereof. A pair of cylindrical metal tubes 33', 43' are arranged on the input side of the travelling wave tube and are joined to the top and bottom broad walls of the hollow wave guide 47 about the openings thereof. Each of the metal tubes 33', 43' extend from the broad walls of the hollow wave guide 47, respectively, in perpendicular relation thereto. The helix 1 is enclosed by a metal cylinder 32 over its entire length, an end turn of said helix being surrounded by the apertured metal discs 33 and 34, respectively. The extended wires 35, 36 of the helix 1 are connected to a second metal discs 37′, 38. These metal discs are similar to the metal discs used in the embodiment of FIG. 4. Within the metal cylinder 37 the electron gun 43 is arranged so that the electron stream emitted by said electron gun may pass through the apertures formed in the discs 37′, 33, through the helix 1, through the apertured discs 34, 38, and to be finally collected by the collector 44. The electron stream is focused in the axial direction by the focusing coil 45′ so that the electron stream will not be intercepted by the helix when the electron stream flows therethrough. The vacuum seal in the travelling wave tube is insured by the cylindrical glass members 41, 42 and glass discs 45, 46, located at the cathode and collector ends, respectively. The signals to be amplified are transmitted in the direction of the arrow by means of the hollow wave guide 47, between the metallic discs 37′, 33, which form between them a transmission line capable of supporting the dominant $TE_{1,0}$ mode propagating in the wave guide 47. The electric field generated is perpendicular to the metal disc plates 37′, 33 and therefore induces within the wire 35 which extends from an end turn of the helix 1, an input signal. The tuning plunger 49 serves to match the input impedance of the helix to the characteristic impedance of the input wave guide transmission line 47. At the output end of the travelling wave tube the amplified wave is excited in the wave guide 48 by the wire 36, extending from the end turn of the helix located in the aperture of metal disc 34. The tuning plunger 50 serves to match the impedance of the helix to the output wave guide line 48 in order to obtain the maximum transfer of energy from the helix to the output wave guide line 48.

FIG. 5*a* shows an end view of the coupling arrangement taken in cross section at line B—B of FIG. 5. FIG. 5*a* shows in a clearer fashion how the input line is arranged with respect to the travelling wave tube in order to afford the greatest degree of coupling between the input wave guide line and the helix transmission line 1.

FIG. 6 is a modification of the coupling arrangement previously described wherein the capacitive effect of the glass vessel 10, which serves to insure a vacuum-tight envelope, is compensated. This compensation is obtained by forming a shoulder in the metal disc 52 adjacent one of the bounding walls 53′ of an input or output hollow wave guide coupling line 51. The metal discs 52, 52′ are arranged and spaced so as to define a coupling space formed as an extension of the wave guide line 51, the step formation in the metal disc 52 serving to increase the spacing between the two metal discs in the vicinity of the glass envelope 10. This step formation results in an increase in the inductance in the line, thereby compensating the increased capacitive effect of the glass envelope 10. As clearly illustrated, the glass envelope 10 may be sealed to the metal disc 52 to insure a vacuum-tight enclosure.

FIG. 7 is a further modification of FIG. 6 wherein both metal discs 54′ and 55′, forming end plates, respectively, of tubular coupling members 54, 55 and defining between themselves a coupling space, the discs 54′, 55′, respectively, being aligned with the walls of wave guide line 58, are formed with shoulders 59′ and 60′. In this figure the opposite walls of the wave guide 58, in the vicinity of the metal discs 54′, 55′, is likewise set back or spaced from the glass enclosure 10 as shown at 56, 57. A metallic hollow tube 59 is joined to the hollow wave guide line 58, the hollow metal tube 59 being provided with a quarter wave length choke 60 to effectively short circuit any high frequency energy leaking through the space formed between the wave guide line 58, and the extension thereof, formed by metal discs 54′ and 55′.

While the invention has been illustrated and described as embodied in travelling wave tubes, it is not intended to be limited to the details shown, since various modifications and structural changes may be made without departing in any way from the spirit of the present invention.

Without further analysis, the foregoing will so fully reveal the gist of the present invention that others can by applying current knowledge readily adapt it for various applications without omitting features that, from the standpoint of prior art, fairly constitute essential characteristics of the generic or specific aspects of this invention and, therefore, such adaptations should and are intended to be comprehended within the meaning and range of equivalence of the following claims.

What is claimed as new and desired to be secured by Letters Patent is:

1. A high frequency coupling arrangement for use with a traveling wave tube or the like, comprising, in combination, a vacuum-tight enveolpe; a hollow wave guide transmission line mounted in transverse direction and outside of said envelope; a first and a second metal disc each formed with an aperture and being arranged inside said vacuum-tight envelope, said metal discs being spaced from each other to define a coupling space therebetween and arranged so that said coupling space forms a continuation of said wave guide transmission line having the same impedance as said hollow wave guide transmission line; at least one tubular coupling member attached at one end coaxially with said envelope to one of said discs and having a length equal to one quarter of a wavelength to be coupled to the traveling wave tube; a helix having a uniform pitch being located in said envelope and having one straight end connected to the other one of said metal discs and having an end turn located in said aperture of said one of said metal discs, said helix being arranged outside of said coupling space; and matching means forming part of said hollow wave guide transmission line for matching the impedance of said helix to the latter.

2. A coupling arrangement comprising, in combination, a helix of wire; a transmission line; and an impedance matching section coupling said transmission line to said helix of wire and defining a coupling space between one end of said helix of wire and said transmission line, said matching section including a transverse disc member bounding said coupling space at one side thereof, and a conductive tubular coupling member having an axial length equal to one quarter of a wavelength to be coupled, said member having a disc-shaped end portion with a transverse face bounding said coupling space at the opposite side thereof and being formed with an aperture therein only slightly larger than the diameter of said helix of wire, said disc-shaped portion being positioned over an end portion of said helix of wire, said end portion ending within said disc-shaped portion, and the inner surface of said aperture in said disc-shaped portion enclosing at least one full turn of said helix of wire, a non-helically wound end of said helix extending into said coupling space and connecting said helix to one side of said transmission line, whereby said helix of wire is strongly capacitatively coupled to said disc-shaped portion.

3. A coupling arrangement comprising, in combination, a helix of wire; a transmission line; an impedance matching section coupling said transmission line to said helix of wire and defining a coupling space between one end of said helix of wire and said transmission line, said matching section including a transverse disc member bounding said coupling space at one side thereof, and a conductive tubular coupling member having an axial length equal to one quarter of a wavelength to be coupled, said member having a disc-shaped end portion with a transverse face bounding said coupling space at the opposite side thereof and being formed with a central aperture therein only slightly larger than the diameter of said helix of wire, said disc-shaped portion being positioned over said one end of said helix of wire, said helix of wire being arranged in its entirety outside of said coupling space, and the inner surface of said aperture in said disc-shaped portion enclosing at least the last full turn of said helix of wire; and a non-helical conductor connected to said one end of said helix of wire, extending into said coupling space and connected to said transmission line, whereby said helix of wire is strongly capacitatively coupled to said disc-shaped portion.

4. In an arrangement for coupling a transmission line to a helix of wire, an impedance matching section coupling said transmission line to said helix of wire and defining a coupling space between one end of said helix of wire and said transmission line, said matching section including a transverse disc member bounding said coupling space at one side thereof, and a conductive tubular coupling member having an axial length equal to one quarter of a wavelength to be coupled, said member having a disc-shaped end portion with a transverse face bounding said coupling space at the opposite side thereof and being formed with an aperture therein only slightly larger than the diameter of said helix of wire, said disc-shaped portion being positioned over an end portion of said helix of wire, said helix of wire being arranged in its entirety outside of said coupling space, and the inner surface of said aperture in said disc-shaped portion enclosing at least one full turn of said helix of wire; and a non-helical conductor connected to said one end of said helix of wire, extending into said coupling space and connected to said transmission line, whereby said helix of wire is strongly capacitatively coupled to said disc-shaped portion.

5. In a traveling wave tube, in combination, a helical delay line; a transmission line transversely arranged for the transfer of high frequency energy to said tube; an impedance matching section coupling said transmission line to said helical delay line and defining a coupling space between said helical delay line and said transmission line, said impedance matching section including a transverse disc member bounding said coupling space at one side thereof, and a conductive tubular coupling member having an axial length equal to one quarter of a wavelength to be coupled, said member having a disc-shaped end portion with a transverse face bounding said coupling space at the opposite side thereof and being formed with a central aperture therein only slightly larger than the diameter of said helical delay line, said disc-shaped portion being positioned over an end portion of said helical delay line, said helical delay line being arranged in its entirety outside of said coupling space, and the inner surface of said aperture in said disc-shaped portion enclosing at least the end turn of said helical delay line; and a non-helical conductor connected to said end portion of said helical delay line, extending into said coupling space and connected to said transmission line, whereby said helical delay line is strongly capacitatively coupled to said disc-shaped portion.

6. In a traveling wave tube, in combination, a helical delay line having a plurality of helical turns; a wave guide transmission line transversely arranged for the transfer of high frequency energy to said tube; an impedance matching section coupling said transmission line to said helical delay line including a first conductive tubular coupling member having an axial length equal to one quarter of a wavelength to be coupled, said member having a disc-shaped end portion formed with a central aperture therein only slightly larger than the diameter of said helical delay line, said disc-shaped portion being positioned over an end portion of said helical delay line, and the inner surface of said aperture in said disc-shaped portion enclosing at least the end turn of said helical delay line, whereby said helical delay line is strongly capacitatively coupled to said disc-shaped portion, a second conductive member having a disc-shaped portion formed with a central aperture therein of a size similar to that of the aperture in the other conductive member, said disc-shaped portion of said second conductive member being spaced from said first conductive member to form a coupling space therebetween and being parallel to the disc-shaped portion of said first conductive member, the apertures in said disc-shaped portions being aligned, said two disc-shaped portions forming extensions of a pair of opposite inner walls of said wave guide transmission line, said helical delay line being connected to said second conductive member, the turns of said helical delay line being in their entirety outside of said coupling space; and a non-helical conductor connected to said end portion of said helical delay line, extending into said coupling space and connected to said transmission line.

7. In a traveling wave tube, in combination, a helical delay line having a plurality of turns; a wave guide transmission line transversely arranged for the transfer of high frequency energy to said tube; an impedance matching section coupling said transmission line to said helical delay line including a first conductive tubular coupling member having an axial length equal to one quarter of a wavelength to be coupled, said member having a disc-shaped portion formed with a central aperture therein only slightly larger than the diameter of said helical delay line, said disc-shaped portion being positioned over an end portion of said helical delay line, and the inner surface of said aperture in said disc-shaped portion enclosing at least the end turn of said helical delay line, whereby said helical delay line is strongly capacitively coupled to said disc-shaped portion formed with a central aperture therein of a size similar to that of the aperture in the other conductive member, said disc-shaped portion of said second conductive member being spaced from said first conductive member to form a coupling space therebetween and being parallel to the disc-shaped portion of said first conductive member and the apertures in said disc-shaped portions being aligned, said two disc-shaped portions forming extensions of a pair of opposite inner walls of said wave guide transmission line, said helical delay line being connected to said second conductive member, the turns of said helical delay line being in their entirety outside of said coupling space; at least one of said disc-shaped portions being formed with a shoulder near the envelope of said traveling wave tube; and a non-helical conductor connected to said end portion of said helical delay line, extending into said coupling space and connected to said transmission line.

References Cited in the file of this patent

UNITED STATES PATENTS

| | | |
|---|---|---|
| 2,602,148 | Pierce | July 1, 1952 |
| 2,611,102 | Bohlke | Sept. 16, 1952 |
| 2,636,948 | Pierce | Apr. 28, 1953 |
| 2,708,727 | Quate | May 17, 1955 |
| 2,740,917 | Haeff | Apr. 3, 1956 |
| 2,761,915 | Pierce | Sept. 4, 1956 |
| 2,765,421 | Robertson | Oct. 2, 1956 |
| 2,828,440 | Dodds et al. | Mar. 25, 1958 |